(12) United States Patent
Hayami

(10) Patent No.: US 6,967,394 B2
(45) Date of Patent: Nov. 22, 2005

(54) MULTI-CHIP PACKAGE

(75) Inventor: Keiko Hayami, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 25 days.

(21) Appl. No.: 10/748,257

(22) Filed: Dec. 31, 2003

(65) Prior Publication Data
US 2004/0195681 A1 Oct. 7, 2004

(30) Foreign Application Priority Data
Mar. 25, 2003 (JP) ............................. 2003/081948

(51) Int. Cl.⁷ ........................................... H01L 23/495
(52) U.S. Cl. ..................... 257/666; 257/676; 257/777
(58) Field of Search ................................ 257/777, 666, 257/676

(56) References Cited

U.S. PATENT DOCUMENTS 6,087,722 A    7/2000  Lee et al.
6,410,987 B1 * 6/2002  Kanemoto et al. .......... 257/777

* cited by examiner

Primary Examiner—Roy Potter
(74) Attorney, Agent, or Firm—Rabin & Berdo, PC

(57) ABSTRACT

An auxiliary lead 6 is arranged so as to support a first semiconductor chip 1 at a corner of a first face of the first semiconductor chip 1 and extend toward an outside of the first semiconductor chip 1, thereby providing a multi-chip package in which a wire does not pass over the auxiliary lead at time of wire bonding so that the auxiliary lead and the wire may not short-circuit with each other.

18 Claims, 3 Drawing Sheets

MULTI-CHIP PACKAGE

CROSS REFERENCE TO RELATED APPLICATION

The present application claims priority under 35 U.S.C §119 to Japanese Patent Application No. 2003-81948, filed Mar. 25, 2003, which is herein incorporated by reference in their entirety for all purposes.

BACKGROUND OF THE INVENTION

1. Field of the Invention

The present invention relates to a multi-chip package having a structure that supports a corner of a first face of a semiconductor chip by using a plurality of auxiliary leads.

2. Description of the Related Art

Recently, with a demand for miniaturization of an electronic apparatus, semiconductor devices have been required to be smaller ever increasingly. Therefore, as one solution for miniaturization of semiconductor devices, such a semiconductor device has been proposed as to have a multi-chip package (MCP) structure in which a plurality of semiconductor chips are mounted in one package.

As a demand for thinning of packages has been increasing year by year, to decrease a thickness of the packages, such a package structure is brought forth as to eliminate a die pad on which a semiconductor chip is placed conventionally. For example, see U.S. Pat. No. 6,087,722.

However, in a conventional example, an auxiliary lead is arranged between a lead and a bonding pad, so that to interconnect the lead and the bonding pad by wire bonding, a wire must pass over the auxiliary lead by any means. Accordingly, to avoid short-circuiting of the wire and the auxiliary lead, a certain height of the wire must be reserved or a certain distance must be reserved between the lead and the bonding pad. Therefore, a total thickness of a package cannot be reduced to a minimum or the package occupies a large area, which is a problem.

SUMMARY OF THE INVENTION

An object of the present invention is to provide a multi-chip package in which a problem of short-circuiting which may occur during wire bonding can be solved, and a total thickness of the package can be kept small.

In order to solve the problem, the present invention is directed to a multi-chip package comprising a rectangular first semiconductor chip having a first face on which a plurality of bonding pads are formed and a second face opposite to the first face; a rectangular second semiconductor chip which is mounted on the first face of the first semiconductor chip and which has a first face on which a plurality of bonding pads are formed and a second face that faces the first face of the first semiconductor chip; a plurality of leads electrically connected with the plurality of bonding pads of the first semiconductor chip or the plurality of bonding pads of the second semiconductor chip; an auxiliary lead which supports the first semiconductor chip at a corner of the first face of the first semiconductor chip and which extends toward an outside of the first semiconductor chip; and a sealant for sealing the auxiliary lead, part of the leads, the first semiconductor chip, and the second semiconductor chip.

DETAILED DESCRIPTION OF THE PREFERRED EMBODIMENTS

The following will describe embodiments of the present invention with reference to drawings.

Figure 1:
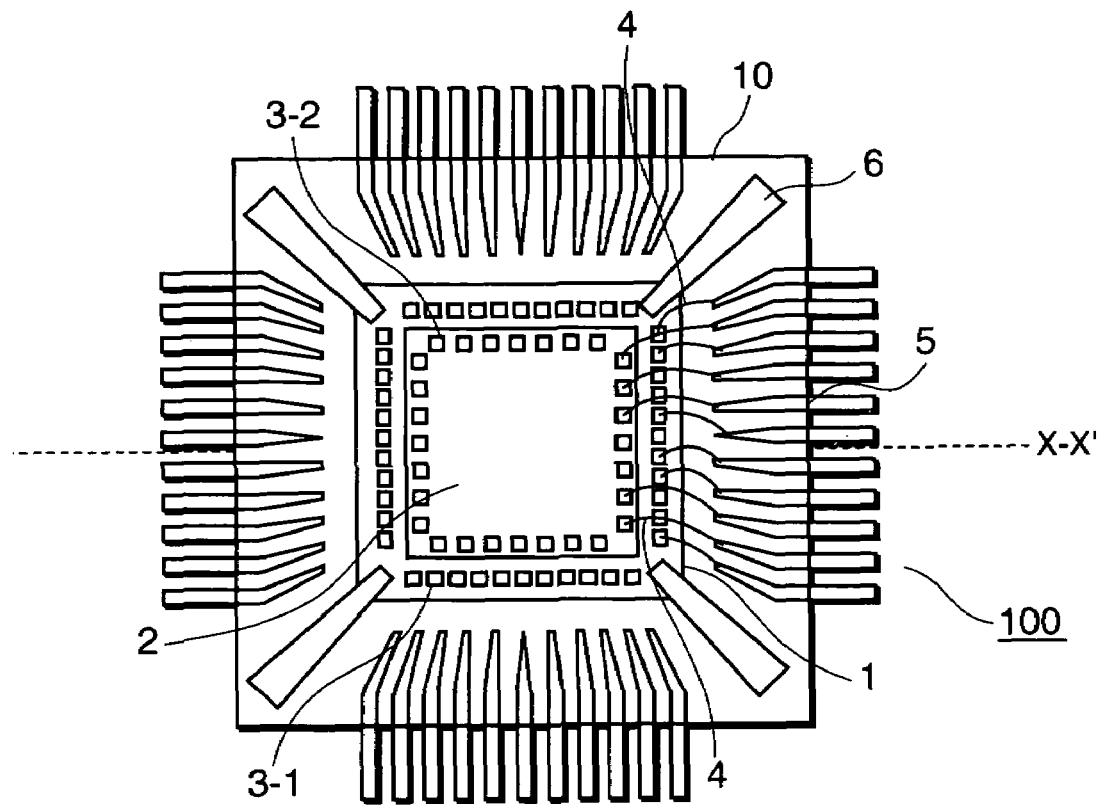
FIG. 1 is a top view for showing a multi-chip package according to a first embodiment of the present invention.
Figure 2:
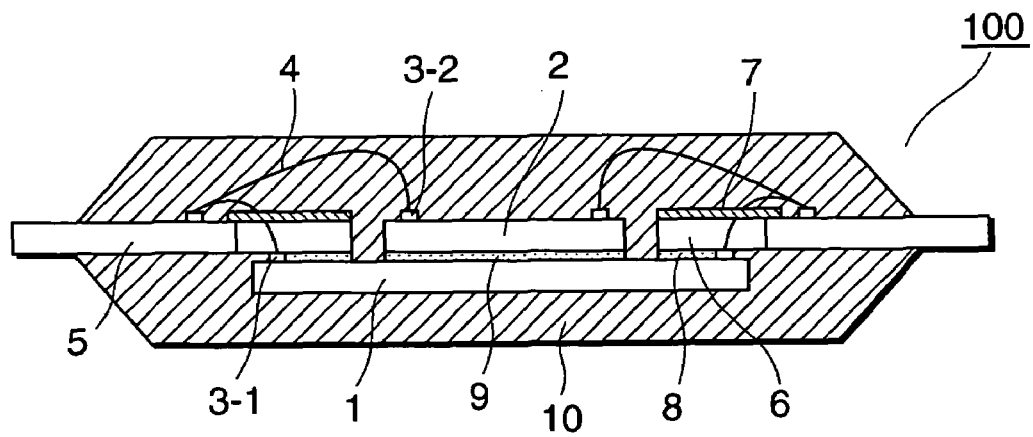
FIG. 2 is a cross-sectional view for showing the multi-chip package according to the first embodiment taken along the line X–X' of FIG. 1.

FIG. 1 is a top view for showing a multi-chip package according to the first embodiment of the present invention. FIG. 2 is a cross-sectional view for showing the multi-chip package according to the first embodiment taken along the line X–X' of FIG. 1.

In a multi-chip package 100, a first semiconductor chip (rectangular LSI chip in this case) 1 has a first face and a second face, on which first face a plurality of bonding pads 3-1 are arranged in such a manner as to go along four sides. Similarly, a second semiconductor chip (rectangular LSI chip in this case) 2 has a first face and a second face, on which first face a plurality of bonding pads 3-2 are arranged in such a manner as to go along four sides. The second semiconductor chip 2 is mounted in such a manner that its second face may face the first face of the first semiconductor chip 1. Each of the bonding pads 3-1 of the first semiconductor chip 1 and/or each of bonding pads 3-2 of the second semiconductor chip 2 is electrically connected with a lead 5 by using a wire 4 (part of which are only illustrated and they are not restrictive). In a certain case, the bonding pad 3-1 of the first semiconductor chip 1 and the bonding pad 3-2 of the second semiconductor chip 2 may be interconnected electrically. An auxiliary lead 6 supports the first semiconductor chip 1 at a corner of the first face of the first semiconductor chip and also extends out from the first semiconductor chip 1. The plurality of auxiliary leads 6 are used to support the first face of the first semiconductor chip 1 with an adhesive agent 8 (it is supported using an epoxy-based thermosetting adhesive material not shown in FIG. 1. It is not restrictive though).

Since the first face of the first semiconductor chip 1 is supported by the auxiliary leads 6, a thickness of a sealant 10 is determined by the respective heights of the first semiconductor chip 1, the second semiconductor ship 2, and the wire 4, so that the lead 6 has no influence on a total thickness of the sealant 10. Moreover, since the auxiliary leads 6 support the first semiconductor chip 1 at the corners of the first face of the first semiconductor chip 1 and also extend out from the first semiconductor chip 1 (especially when the leads 5 are arranged so as to respectively face mutually opposite two sides of the first semiconductor chip 1), the wire 4 does not pass over the auxiliary lead 6 between the lead 5 and the bonding pad 3-1 or 3-2 at time of wire bonding. Further, since the auxiliary lead 6 supports the first semiconductor chip 1 at a given corner of the first face of the first semiconductor chip 1 and extends between extension lines of the first semiconductor chip 1 that sandwich the corner of the first face of the first semiconductor chip 1, it is possible to accommodate a shape that the leads 5 are arranged for every one of the four sides of the first semiconductor chip 1, thus making the present invention more applicable. In this case also, the wire 4 does not pass over the auxiliary lead 6 between the lead 5 and the bonding pad 3-1 or 3-2 at time of wire bonding. In particular, since the auxiliary lead 6 extends along a diagonal extension line of the first semiconductor chip 1, it is possible to accommodate a profile in which the lead 5 is arranged for every one of the four sides of the first semiconductor chip 1 and also to provide very high strength against twisting after sealing. Furthermore, by extending the auxiliary lead 6 along the diagonal extension line of the first semiconductor chip 1, the lead 5 can be arranged in a large space, so that it is possible to bring the leads 5 close to the bonding pads 3-1 and 3-2 unlimitedly and also to reduce the height of the wire. Furthermore, since the plurality of auxiliary leads 6 become gradually thick as they extend toward an outside of the first semicbnductor chip 1, stress applied on the first semiconductor chip 1 and the second semiconductor chip 2 when resin is poured can be made more even, thereby making the strength higher. Further, the auxiliary leads 6 are covered by an insulating protection film 7 (e.g., mixture of epoxy resin and poly-imide resin). By covering the auxiliary leads 6 by using the insulating protection film 7, the wire 4 can be prevented from coming in contact with the auxiliary lead 6 owing to pressure which is applied at time of sealing by use of the resin. It is, in turn, possible to prevent a yield from decreasing due to short-circuiting of the wire.

The first semiconductor chip 1, the second semiconductor chip 2, the bonding pads 3-1 and 3-2, the wires 4, the leads 5, the auxiliary leads 6, the insulating protection film 7, and the adhesive agent 9 are sealed by the sealant 10 (e.g., mold resin).

Figure 3:
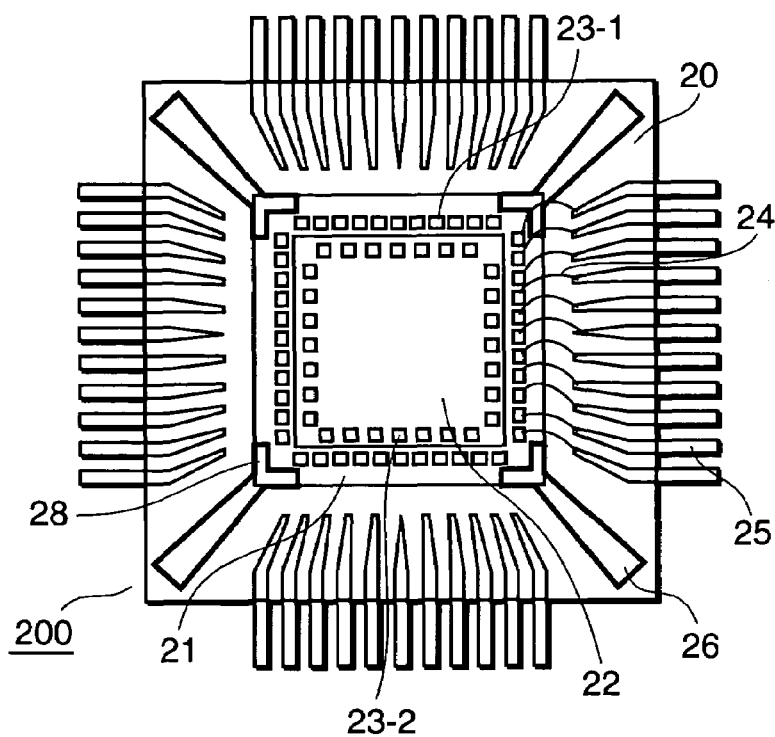
FIG. 3 is a top view of a variant of the multi-chip package according to the first embodiment of the present invention.

The following will describe a variant of the first embodiment. FIG. 3 is a top view of the variant of the multi-chip package according to the first embodiment of the present invention.

The variant of the first embodiment shown in FIG. 3 is different from the example shown in FIG. 1 in the shape of an auxiliary lead 26. The same components of FIG. 3 as those of FIG. 1 are indicated by the same reference numerals and their detailed description is omitted. The auxiliary lead 26 of a multi-chip package 200 comprises at its tip a plurality of diverging portions 28. The diverging portions 28 are respectively arranged in the vicinity of each of the corners of a first face of a first semiconductor chip 21. Further, the diverging portions 28 each extend along a side of the first semiconductor chip 21. Furthermore, the auxiliary lead 26 and the diverging portions 28 of the auxiliary lead 26 are covered by an insulating protection film 27 (mixture of epoxy resin and poly-imide). The auxiliary lead 26 has the diverging portions 28 at its tip, so that it is possible to reserve a larger adhesion area. Of course, the diverging portions 28 are part of the auxiliary lead 26 and so support the first semiconductor chip 21 in much the same way as the auxiliary lead 26. The area for adhering the first semiconductor chip 21 can thus be increased to increase strength with which the first semiconductor chip 21 is fixed, thereby preventing the first semiconductor chip 21 from being shifted due to pressure at time of sealing by use of the resin. Further, by arranging the auxiliary lead 26 along the side of the first semiconductor chip 21, it is possible to mount a larger second semiconductor chip 22 in a space surrounded by bonding pads 23-1 on the first face of the first semiconductor chip 21. Although part of the diverging portions 28 are arranged between the bonding pads 23-1 and leads 25, the diverging portions 28 are covered by the insulating protection film 27. Therefore, it is possible to prevent the wire 24 from coming in contact with the auxiliary lead 26 and also the wire 24 from loosening and coming in contact with the auxiliary lead 26.

Figure 4:
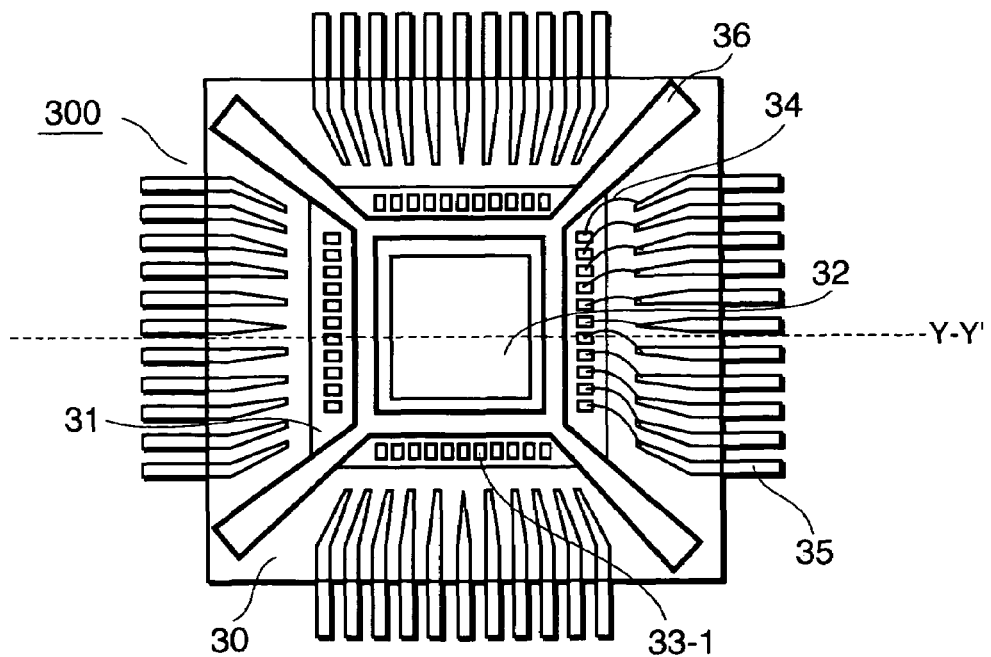
FIG. 4 is a top view for showing a multi-chip package according to a second embodiment of the present invention.
Figure 5:
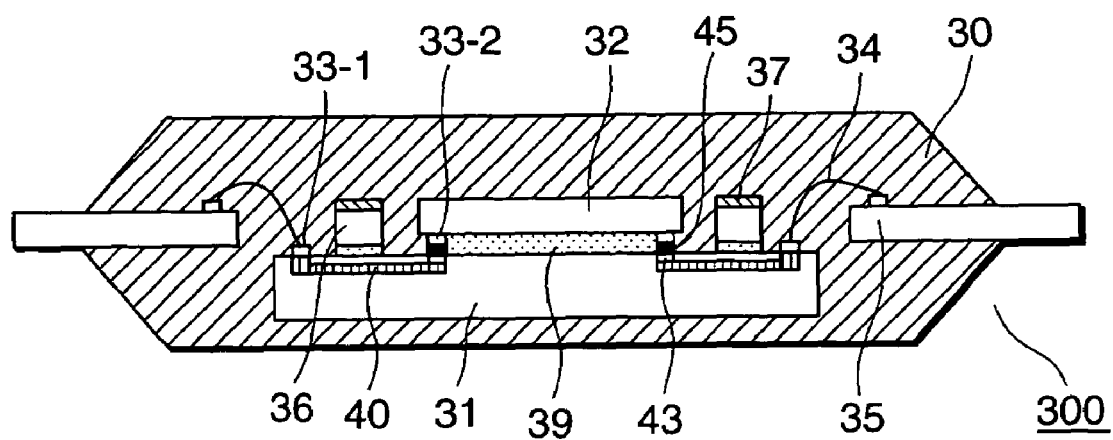
FIG. 5 is a cross-sectional view for showing the multi-chip package according to the second embodiment taken along the line Y–Y' of FIG. 4.

FIG. 4 is a top view for showing a multi-chip package according to a second embodiment of the present invention. FIG. 5 is a cross-sectional view for showing the multi-chip package according to the second embodiment taken along the line Y–Y' of FIG. 4.

As shown in FIGS. 4 and 5, in a multi-chip package 300 according to the present invention, on a first face of a first semiconductor chip (rectangular LSI chip in this case) 31, a plurality of bonding pads 33-1 are arranged in such a manner as to go along four sides. Part of the bonding pads 33-1 that are predetermined are each connected electrically with a conductor (contact plug in this case) 43 by using a wiring line 40 formed in the first semiconductor chip 31. On a first face of a second semiconductor chip (LSI chip in this case) 32, a plurality of bonding pads 33-2 are arranged in such a manner as to go along four sides. Further, on each of the bonding pads 33-2 of the second semiconductor chip, a bump 45 is formed. The bump 45 is electrically connected with the conductor 43. That is, the second semiconductor chip 32 is mounted on the first semiconductor chip 31 in such a manner that a first face of the second semiconductor chip 32 may face the first face of the first semiconductor chip 31, and also the first semiconductor chip 31 and the second semiconductor chip 32 are electrically interconnected through the conductor 43 and the bump 45. As occasion demands, the first semiconductor chip 31 and the second semiconductor chip 32 are fixed using such an adhesive agent as shown in FIG. 5. The bonding pads 33-1 of the first semiconductor chip 31 are each connected electrically with the lead 35 with a wire 34. An auxiliary frame 36 supports a region which surrounds corners of the first face of the first semiconductor chip 31 and an outer periphery of the second semiconductor chip 32 mounted on the first semiconductor chip 31 and also extends toward an outside of the first semiconductor chip 31. As occasion demands, the auxiliary frame 36 is integrally formed. To the auxiliary frame 36, the first face of the first semiconductor chip 31 is fixed using an adhesive agent 39 made of an epoxy-based thermosetting adhesive material etc.

Since the first face of the first semiconductor chip 31 is supported by the auxiliary frame 36, a thickness of a sealant 30 is determined by the respective heights of the first semiconductor chip 31, the second semiconductor chip 32, and the wire 34, so that a thickness of the auxiliary frame 36 has no influence on a total thickness of the sealant 30. Further, the auxiliary frame 36 supports the region which surrounds the corners of the first face of the first semiconductor chip 31 and the outer periphery of the second semiconductor chip 32 and also extends toward the outside of the first semiconductor chip 31, thereby enabling reserving a larger adhesion area than in the first embodiment. Further, it enables well-balanced adhesion between the auxiliary frame 36 and the first semiconductor chip 31. Therefore, the first semiconductor chip 31 is fixed with higher strength, thus enabling preventing a yield from decreasing due to a shift in position of the first semiconductor chip at time of pouring of resin. Further, a sufficient space for arranging the leads 35 can be reserved on a periphery of the first semiconductor chip 31, so that it is possible to arrange the leads 35 as many as necessary corresponding to the number of the bonding pads 33-1 of the first semiconductor chip 31. That is, a degree of freedom of arranging the leads 35 increases. Further, the leads 35 can be brought close to the bonding pads 33-1 unlimitedly, thus reducing the height of the wire. Furthermore, the fixing strength can be kept highest because a portion of the auxiliary frame 36 which externally extends out of the first semiconductor chip 31 extends along a diagonal extension line of the first semiconductor chip 31 so that a pressure of the resin may be applied evenly to the first semiconductor chip 31 and the second semiconductor chip 32 at time of sealing by use of the resin. Further, since the auxiliary frames 36 become gradually thick as it extends toward an outside of the first semiconductor chip, stress applied on the first semiconductor chip 31 and the second semiconductor chip 32 when the resin is poured can be made more even, thus keeping the strength higher.

In contrast to a profile in which the second semiconductor chip 32 is mounted on the first semiconductor chip 31 in such a manner that the second face of the second semiconductor chip 32 may face the first face of the first semiconductor chip 31, in a profile according to the present embodiment in which the second semiconductor chip 32 is mounted on the first semiconductor chip 31 in such a manner that the first face of the second semiconductor 32 chip may face the first face of the first semiconductor chip 31 and also in which the first semiconductor chip 31 and the second semiconductor chip 32 are electrically interconnected through the conductor 45, the wire 34 does not pass over the auxiliary frame 36, thus preventing short-circuiting of the auxiliary frame 36 and the wire 34. That is, it is possible to prevent a drop in yield owing to electric short-circuiting. Further, according to the present embodiment, wire bonding is carried out only from the bonding pad 33-1 of the first semiconductor chip 31 to the lead 35, so that the height of the wire has little influence on the total thickness of the sealant. That is, the total thickness of the sealant can be further decreased.

As described above, according to the present invention, a structure in which the auxiliary lead or the auxiliary frame supports the first semiconductor chip at its corners and also extends out of the first semiconductor chip is employed enables providing a multi-chip package that has a high yield while simultaneously keeping the total thickness of the package small.

What is claimed is:

1. A multi-chip package comprising:
   a rectangular first semiconductor chip having a first face on which a plurality of bonding pads are formed and a second face opposite to the first face;
   a rectangular second semiconductor chip which is mounted on the first face of the first semiconductor chip and which has a first face on which a plurality of bonding pads are formed and a second face that faces the first face of the first semiconductor chip;
   a plurality of leads electrically connected, using respective wires, with the bonding pads of the first and second semiconductor chips;
   an auxiliary lead which supports the first semiconductor chip at a corner of the first face of the first semiconductor chip and which extends toward an outside of the first semiconductor chip so that the wires do not pass over the auxiliary lead; and
   a sealant for sealing the auxiliary lead, a part of the leads, the first semiconductor chip, and the second semiconductor chip.

2. The multi-chip package according to claim 1, wherein the auxiliary lead extends between extension lines of two sides of the first semiconductor chip that form the corner of the first semiconductor chip, the extension lines extending toward the outside of the first semiconductor chip.

3. The multi-chip package according to claim 1, wherein a part of the auxiliary lead which externally extend out of the first semiconductor chip extends along a diagonal extension line of the first semiconductor chip.

4. The multi-chip package according to claim 2, wherein a part of the auxiliary lead which externally extend out of the first semiconductor chip extends along a diagonal extension line of the first semiconductor chip.

5. The multi-chip package according to claim 1, wherein the auxiliary lead is positioned in a vicinity of the corner of the first semiconductor chip and has a plurality of diverging portions that support the first face of the first semiconductor chip.

6. The multi-chip package according to claim 5, wherein the diverging portions of the auxiliary lead support the corner of the first semiconductor chip along sides of the first semiconductor chip.

7. The multi-chip package according to claim 1, wherein the auxiliary lead becomes gradually thick, as it extends toward an outside of the first semiconductor chip.

8. The multi-chip package according to claim 1, wherein the auxiliary lead is covered with an insulating protection film.

9. A multi-chip package comprising:
   a rectangular first semiconductor chip having a first face on which a plurality of bonding pads are formed and a second face opposite to the first face;
   a rectangular second semiconductor chip which is mounted on the first face of the first semiconductor chip and which has a first face on which a plurality of bonding pads are formed and a second face opposite the first face of the semiconductor chip;
   a plurality of leads electrically connected with the plurality of bonding pads of the first and second semiconductor chips;
   an auxiliary frame which supports a region surrounding corners of the first face of the first semiconductor chip and an outer periphery of the second semiconductor chip mounted on the first semiconductor chip and which extends toward an outside of the first semiconductor chip; and
   a sealant for sealing the auxiliary frame, a part of the leads, the first semiconductor chip, and the second semiconductor chip.

10. The multi-chip package according to claim 9, wherein the auxiliary frame is integrally formed.

11. The multi-chip package according to claim 9, wherein a part of the auxiliary frame which externally extends out of the first semiconductor chip extends along a diagonal extension line of the first semiconductor chip.

12. The multi-chip package according to claim 10, wherein a part of the auxiliary frame which externally extends out of the first semiconductor chip extends along a diagonal extension line of the first semiconductor chip.

13. The multi-chip package according to claim 9, wherein the plurality of bonding pads formed on the first semiconductor chip are arranged along four sides of the first semiconductor chip and positioned between an outer periphery of the first semiconductor chip and the auxiliary frame.

14. The multi-chip package according to claim 1, wherein the first semiconductor chip and the second semiconductor chip are arranged in such a manner that the first face of the first semiconductor chip and the first face of the second semiconductor chip face each other.

15. The multi-chip package according to claim 9, wherein the first semiconductor chip and the second semiconductor chip are arranged in such a manner that the first face of the first semiconductor chip and the first face of the second semiconductor chip may face each other.

16. The multi-chip package according to claim 15, wherein a plurality of bumps are formed on the plurality of bonding pads of the second semiconductor chip, a conductor which is electrically connected with each of the bumps is formed on the first semiconductor chip, and a wiring line for electrically interconnecting the conductor and part of the bonding pads of the first semiconductor chip arbitrarily is formed.

17. The multi-chip package according to claim 16, wherein the wiring line is formed in the first semiconductor chip.

18. The multi-chip package according to claim 9, wherein the auxiliary frame becomes gradually thick as it extends to an outside of the first semiconductor chip.

* * * * *